(12) United States Patent
Takahashi et al.

(10) Patent No.: US 8,378,556 B2
(45) Date of Patent: Feb. 19, 2013

(54) ACTUATOR ELEMENT AND INPUT APPARATUS INCLUDING THE SAME

(75) Inventors: Isao Takahashi, Miyagi-ken (JP); Nobuaki Haga, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/235,293

(22) Filed: Sep. 16, 2011

(65) Prior Publication Data

US 2012/0007476 A1      Jan. 12, 2012

Related U.S. Application Data

(63) Continuation of application No. PCT/JP2010/056563, filed on Apr. 13, 2010.

(30) Foreign Application Priority Data

Apr. 17, 2009   (JP) ................. 2009-100671

(51) Int. Cl.
*H01L 41/08* (2006.01)
(52) U.S. Cl. ........ 310/330; 310/331; 310/309; 257/414; 257/415; 257/416
(58) Field of Classification Search .............. 310/309, 310/330–332; 257/414–416
See application file for complete search history.

(56) References Cited

U.S. PATENT DOCUMENTS

| | | | | |
|---|---|---|---|---|
| 6,759,787 | B2 * | 7/2004 | Miller et al. | 310/309 |
| 7,550,855 | B2 * | 6/2009 | Hantschel et al. | 257/776 |
| 7,699,296 | B1 * | 4/2010 | Knollenberg et al. | 267/160 |
| 2005/0253487 | A1 * | 11/2005 | Allan et al. | 310/331 |
| 2006/0038643 | A1 | 2/2006 | Xu et al. | |
| 2007/0284968 | A1 * | 12/2007 | Takeuchi | 310/332 |
| 2009/0320992 | A1 | 12/2009 | Xu et al. | |

FOREIGN PATENT DOCUMENTS

| | | |
|---|---|---|
| JP | 06217561 A * | 8/1994 |
| JP | 2004-252337 | 9/2004 |
| JP | 2005-27444 | 1/2005 |
| JP | 2006-166638 | 6/2006 |
| JP | 2007-28749 | 2/2007 |
| JP | 2007-118159 | 5/2007 |

OTHER PUBLICATIONS

Search Report dated Jul. 27, 2010 from International Application No. PCT/JP2010/056563.

* cited by examiner

*Primary Examiner* — J. San Martin
(74) *Attorney, Agent, or Firm* — Beyer Law Group LLP

(57) ABSTRACT

An actuator element includes a first element unit configured to have one end being a fixed end and the other end being a free end and bends when voltage is applied, and a second element unit configured to have a shorter element length than the first element unit, have one end connected to the first element unit and bend in the opposite direction to the first element unit when voltage is applied and may support the first element unit.

9 Claims, 9 Drawing Sheets

PRIOR ART

ACTUATOR ELEMENT AND INPUT APPARATUS INCLUDING THE SAME

CLAIM OF PRIORITY

This application is a Continuation of International Application No. PCT/JP2010/056563 filed on Apr. 13, 2010, which claims benefit of Japanese Patent Application No. 2009-100671 filed on Apr. 17, 2009. The entire contents of each application noted above are hereby incorporated by reference.

BACKGROUND OF THE INVENTION

1. Field of the Invention

The present invention relates to actuator elements that bend when voltage is applied and input apparatuses.

2. Description of the Related Art

FIGS. 13A and 13B are conceptual diagrams (section views) of an input apparatus for explaining problems in the past.

An input apparatus 1 illustrated in FIG. 13A has actuator elements 2, a base member 3, fixing units 4, a key top 5, and a housing 6.

As illustrated in FIG. 13A, the actuator elements 2 are fixed to and are supported by the fixing units 4 in a cantilever form. Each of the actuator elements 2 may have an electrolytic layer and a pair of electrode layers provided on both sides of the electrolytic layer in the direction of thickness, for example. When voltage is applied to the pair of electrode layers on the fixed end, the actuator element bends upward, as illustrated in FIG. 13A.

The actuator element 2 has a lower modulus of elasticity and lower rigidity than a piezoelectric ceramic or a shape-memory alloy and may easily produce a large displacement. However, the actuator element 2 may not exert large force easily, which is a problem. If the modulus of elasticity and element thickness of the actuator element 2 are increased, the load may be increased. However, the amount of displacement may be reduced proportionately.

In other words, it has been difficult to acquire a sufficient amount of displacement and sufficient load (generative force) for producing a good feel of pushing when the key top 5 is pushed downward from the state in FIG. 13A to the state in FIG. 13B.

Reference may be made to Japanese Unexamined Patent Application Publication Nos. 2006-166638, 2005-27444, 2007-28749, and 2007-118159.

The inventions of the aforementioned patent documents have problems of the difficulty to acquire a good feel of pushing and their complicated structures resulting in larger element structures.

SUMMARY OF THE INVENTION

The present invention was made in order to solve the problems in the past, and the invention provides an actuator element and an input apparatus which may produce a sufficient displacement and a large load and generative force in a simple structure.

An actuator element according to the present invention includes a first element unit configured to have one end being a fixed end and the other end being a free end and bends when voltage is applied, and a second element unit configured to have a shorter element length than the first element unit, have one end connected to the first element unit, bend in the opposite direction to the first element unit when voltage is applied and support the first element unit.

Thus, a sufficient displacement and a large generated load and generative force may be acquired in a simple structure.

According to the present invention, the second element unit may be connected to the free end or a middle part between the free end and fixed end of the first element unit and may extend from the connected position toward the fixed end of the first element unit. Thus, the generated load and generative force may be increased more effectively. When the second element unit is connected to a middle part as described above and even when the amount of displacement of the second element unit is small, the first element unit may be easily supported.

Alternatively, according to the present invention, the second element unit may be connected to a middle part between the free end and fixed end of the first element unit and extend from the connected position toward the free end of the first element unit.

According to the present invention, each of the first element unit and the second element unit may have an electrolytic layer and a pair of electrode layers provided on both sides in the direction of thickness of the electrolytic layer. The electrode layers facing inside of the first element unit and the second element unit may be connected to each other. The electrode layers facing outside of the first element unit and the second element unit may be connected to each other. Thus, one drive circuit may be provided for the first element unit and the second element unit. The simple structure may be implemented effectively, and the costs may be reduced.

According to the present invention, the first element unit may be folded back halfway, and the folded part may function as the second element unit. In this way, the first element unit and second element unit may be formed by a simple process of manufacture. One drive circuit may be provided for the first element unit and the second element unit. Thus, the structure may be simplified, and the costs may be reduced.

According to the present invention, the second element unit having a tongue shape formed by cutting deeply into the first element unit may be folded back. This may prevent the increase of the element area of the actuator element because of the second element unit. The first element unit and second element unit may be formed by a simple process of manufacture. One drive circuit may be provided for the first element unit and the second element unit. Thus, the structure may be simplified, and the costs may be reduced.

According to the present invention, the second element unit integrally formed with the first element unit may be folded back from the free end of the first element unit, and the first element unit may have a hole at a position facing the second element unit. This may reduce the thickness of the actuator element. Moreover, a simple process of manufacture may be used to form the first element unit and the second element unit. Thus, the structure may be simplified, and the costs may be reduced.

According to the present invention, each of the first electrode layer, electrolytic layer and second electrode layer may have a separated first element unit region and second element unit region and a connection part configured to connect the first element unit region and the second element unit region. The first electrode layer and the second electrode layer may be stacked on both sides in the direction of thickness of the electrolytic layer such that the connection part of the first electrode layer and the connection part of the second electrode layer can intersect on a vertical section appearing by cutting in the direction of connection of the connection parts. The first electrode layer and the second electrode layer appearing on the surface may change places with each other in the first element unit and the second element unit. Thus, a sufficient displacement and a large generated load (and generative force) may be acquired in a simple structure. Compared with the structure in which the second element unit is folded back, the stress on the electrolytic layer and/or the electrode layers may be reduced. The first element unit and the second element unit do not overlap in the direction of thickness, and the thickness of the actuator element may be reduced.

An input apparatus according to the present invention includes one of the actuator elements described above, an operating unit provided in the direction of bending of a first element unit of the actuator element, and a base member provided in the direction of bending of a second element unit. In this case, the operating unit is supported such that it may be moved toward the base member and away from the base member. When voltage is applied, the first element unit bends toward the operating unit and the second element unit bends toward the surface of the base member. When the operating unit moves toward the base member, the free end side of the first element unit is pushed and the first element unit is supported by the second element unit.

According to the present invention, because a large generated load may be acquired, the feel of pushing when the operating unit is pushed may be improved more than before.

BRIEF DESCRIPTION OF THE DRAWINGS

FIG. 1A is a partial section view when an actuator element is not running, and FIG. 1B is a partial section view when the actuator bends;

FIG. 7A illustrates one step of a manufacturing method; and FIG. 7B illustrates a completed actuator element;

FIG. 8A illustrates one step of a manufacturing method. FIG. 8B illustrates a completed actuator element;

FIG. 9A is a partial plan view of an actuator element, and FIG. 9B is a section view of FIG. 9A;

FIG. 10A is an exploded plan view of a first electrode layer, an electrolytic layer, and a second electrode layer included in an actuator element; FIG. 10B is a plan view illustrating a state where the first electrode layer, electrolytic layer and second electrode layer are combined (stacked); and FIG. 10C is a vertical section view in the direction of connection (X direction) enclosed by a broken line;

FIG. 11A is an exploded plan view of a first electrode layer, an electrolytic layer, and a second electrode layer included in an actuator element, and FIG. 11B is a plan view illustrating a state in which the first electrode layer, electrolytic layer and second electrode layer are combined (stacked);

DESCRIPTION OF THE PREFERRED EMBODIMENTS

Figure 1A:
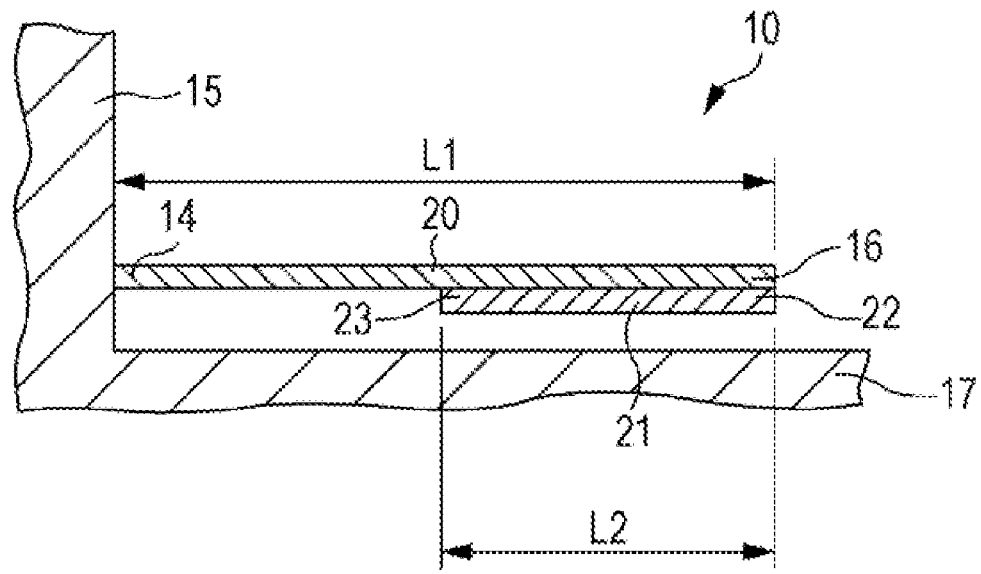
FIGS. 1A and 1B illustrate a configuration of an actuator device of a first embodiment.
Figure 1B:
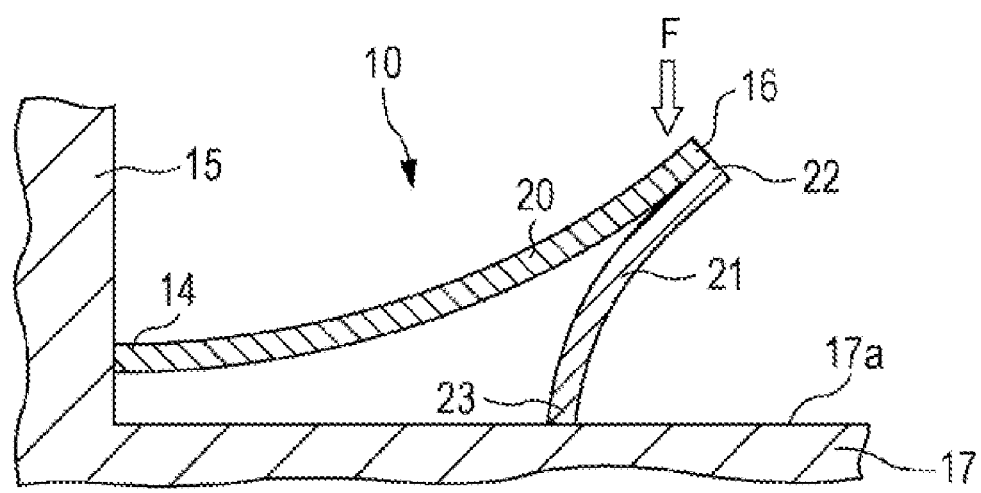

FIGS. 1A and 1B illustrate a configuration of an actuator device of a first embodiment. FIG. 1A is a partial section view when an actuator element is not running, and FIG. 1B is a partial section view when the actuator bends.

Figure 3:
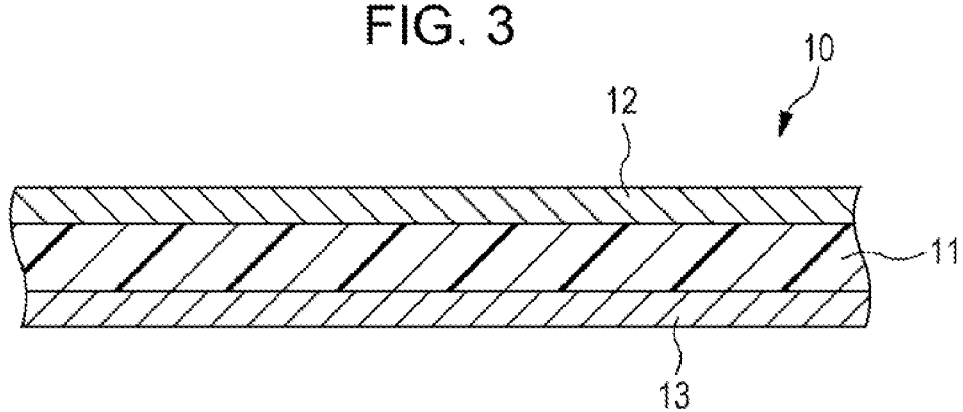
FIG. 3 is a partial enlarged section view of the actuator element.

As illustrated in FIG. 3, an actuator element 10 according to this embodiment is a polymeric actuator including an electrolytic layer 11, and electrode layers 12 and 13 provided on both surface in the direction of thickness of the electrolytic layer 11, for example.

For example, the actuator element 10 of this embodiment may include an electrolytic layer 11 having ion liquid and a base polymer, and a first electrode layer 12 and second electrode layer 13 having a conductive filler such as carbon nanotube, ion liquid and a base polymer.

The base polymer may be polyvinylidene difluoride (PVDF) or polymethyl methacrylate (PMMA), for example. In the concrete example, because the electrolytic layer 11 does not internally contain an ion exchange resin, both cations and anions may move freely.

The electrolytic layer 11 may contain an ion exchange resin and a polarized organic solvent containing a salt or a liquid organic compound which is ion liquid. In this case, the ion exchange resin is preferably a cation exchange resin. Thus, the anions are fixed, and the cations may move freely. The cation exchange resin may be a resin of polyethylene, polystyrene, fluorocarbon polymer or like containing a functional group such as a sulfonic acid group and a carboxyl group. The electrode layers 12 and 13 may be formed by plating or sputtering an electrode layer material such as gold and platinum.

As illustrated in FIG. 1A, the actuator element 10 includes a first element unit 20 and a second element unit 21. For example, both of the first element unit 20 and second element unit 21 has a laminate structure as illustrated in FIG. 3.

As illustrated in FIG. 1A, one end (fixed end) 14 of the first element unit 20 is fixed to and supported by the fixing unit 15. The first element unit 20 is supported in a cantilever form. When voltage is applied to between the pair of electrode layers 12 and 13, the free end 16 side bends upward, as illustrated in FIG. 1B. As illustrated in FIG. 1B, a base member 17 is provided on the opposite surface of the direction of bending of the first element unit 20. The base member 17 and the fixing unit 15 may be provided separately or integrally.

A second element unit 21 is provided on the bottom surface side (base member 17 side) of the first element unit 20 illustrated in FIG. 1A. One end of the second element unit 21 is a connected end 22 to the first element unit 20. As illustrated in FIGS. 1A and 1B, the connected end 22 of the second element unit 21 is connected and fixed to the free end 16 of the first element unit 20. The part excluding the connected end 22 of the second element unit 21 is not fixed to the first element unit 20.

When voltage is applied to between the pair of electrode layers 12 and 13, the second element unit 21 bends in the opposite direction to the first element unit 20. In other words, as in FIG. 1B in operation, the free end 23 of the second element unit 21 bends downward from the state out of operation in FIG. 1A.

As illustrated in FIGS. 1A and 1B, the element length of the first element unit 20 is equal to L1, and the element length of the second element unit 21 is equal to L2. The element length L2 of the second element unit 21 is shorter than the element length L1 of the first element unit 20.

According to this embodiment, when the actuator element 10 is in operation and when the free end 23 of the second element unit 21 is in contact with a surface 17a of the base member 17, as illustrated in FIG. 1B, the first element unit 20 bending upward may be bent in the opposite direction to the first element unit 20 and may be supported by the second element unit 21 having a shorter element length than the first element unit 20.

The free end 23 of the second element unit 21 in operation illustrated in FIG. 1A in contact with the surface 17a of the base member 17 is preferable for preventing the reduction of the amount of displacement. However, slight separation between them is not excluded. In that case, when the free end 16 of the first element unit 20 is pushed downward and falls and the free end 23 of the second element unit 21 is brought into contact with the surface 17a of the base member 17, the first element unit 20 may be supported by the second element unit 21, which can increase the generated load.

The actuator element 10 of this embodiment includes the first element unit 20 and the second element unit 21, implementing a simple structure. According to this embodiment, the first element unit 20 may be supported by the second element unit 21 as illustrated in FIG. 1B. This may increase the reaction (hereinafter, called a generated load) when a force F toward the base member 17 is applied to the free end 16 of the first element unit 20. It further may increase the force (generative force) to the upper part of the actuator element 10.

Moreover, according to this embodiment, without increasing the higher modulus of elasticity and/or element thickness for a higher generated load and a higher generative force, the element length L1 of the first element unit 20 may be increased sufficiently. A sufficient displacement of the actuator element 10 may be acquired when bends as in FIG. 1B. The reduced length dimension L2 of the second element unit 21 may prevent the reduction of the amount of displacement due to the addition of the mass of the second element unit 21. Limiting the length dimension L2 of the second element unit 21 and/or the connection position to the first element unit 20 may further increase the amount of displacement of the first element unit 20, compared with the case where the first element unit 20 is used alone.

Thus, according to this embodiment, a sufficient displacement and a large generated load and generative force may be acquired in a simple structure.

According to the embodiment illustrated in FIGS. 1A and 1B, the second element unit 21 is connected to the free end 16 of the first element unit 20 and extends from the connected position toward the fixed end 14 of the first element unit 20. This may support the free end 16 of the first element unit 20 and may efficiently produce a larger generated load and generative force.

The direction of the extension of the second element unit 21 may be changed from the free end 16 side of the first element unit 20 to the fixed end 14. This allows easy contact of the free end 23 of the second element unit 21 with the surface 17a of the base member 17 during the operation illustrated in FIG. 1B and may prevent the reduction of the amount of displacement. According to this embodiment, the change in direction of extension of the second element unit 21 from the free end 16 side of the first element unit 20 to the fixed end 14 may limit the element length of the actuator element 10 by the element length L1 of the first element unit 20 and may reduce the size of the actuator element 10.

Figure 2A:
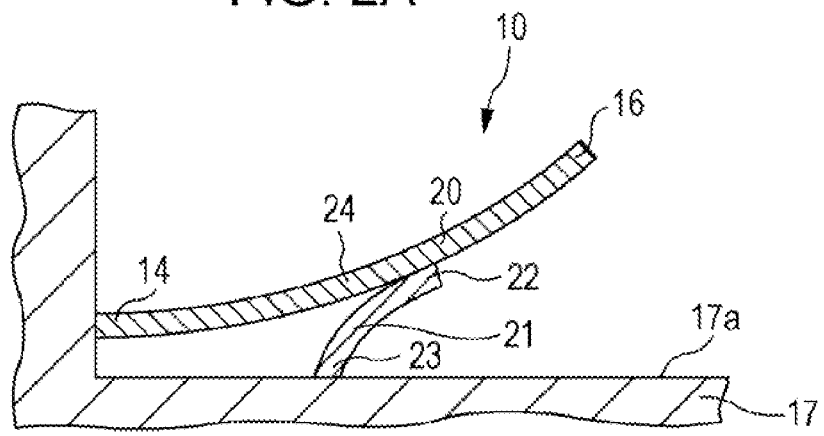
FIGS. 2A and 2B are section views illustrating a configuration of an actuator device of a second embodiment.
Figure 2B:
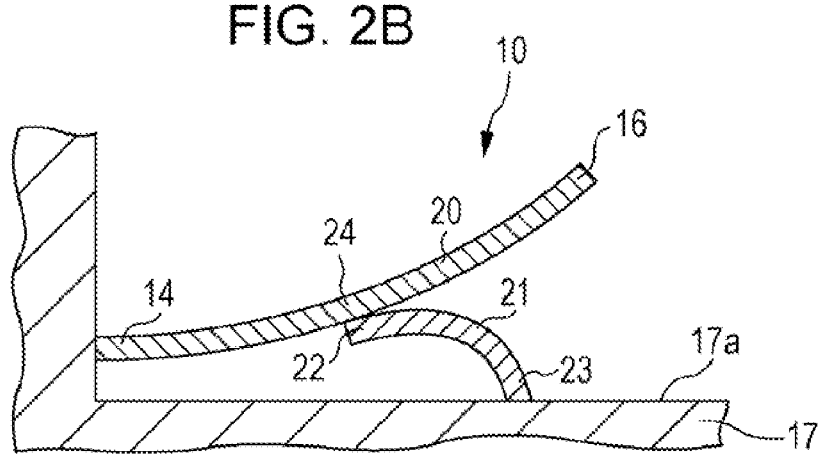

FIGS. 2A and 2B illustrate configuration of an actuator device of a second embodiment. According to the embodiment illustrated in FIGS. 2A and 2B, like the embodiment illustrated in FIGS. 1A and 1B, the actuator element 10 includes a first element unit 20, and a second element unit 21 which has a shorter element length than the first element unit 20 and bends in the opposite direction to the direction of bending of the first element unit 20. According to the embodiment illustrated in FIGS. 2A and 2B, the second element unit 21 is connected to the middle part 24 of the first element unit 20 and may support the first element unit 20 from a middle part 24 during the operation in FIGS. 2A and 2B. This may more efficiently increase the amount of displacement. Alternatively, according to the embodiment in FIGS. 2A and 2B, even when the amount of displacement of the second element unit 21 is small, the first element unit 20 may be easily supported during the operation in FIGS. 2A and 2B. Because the first element unit 20 has the free end 16 which is lifted higher than the middle part 24, the distance from the middle part 24 to the base member 17 is shorter than the distance from the free end 16 to the base member. Thus, connecting the second element unit 21 to the middle part 24 may easily provide the structure in which the free end 23 of the second element unit 21 is abutted against the surface 17a of the base member 17 to support the first element unit 20. This may prevent the reduction of the amount of change due to the mass of the second element unit 21, or the displacement of the second element unit 21 may easily lift the first element unit 20 compared with the case where the first element unit 20 is used alone and may increase the amount of displacement of the first element unit 20.

Comparing between FIG. 2A and FIG. 2B, the second element unit 21 is connected to the first element unit 20 in the opposite directions of connection from each other. Particularly, when the amount of displacement of the second element unit 21 is small, the form in FIG. 2A in which the free end 23 of the second element unit 21 faces the fixed end 14 of the first element unit 20 may support the first element unit 20 more easily than the second element unit 21.

The middle part 24 of the first element unit 20 in FIGS. 2A and 2B refers to some position between the fixed end 14 and the free end 16. With the position of the middle part 24 and the length of the second element unit, the amount of displacement and generated load (generative force) may be adjusted.

Figure 4A:
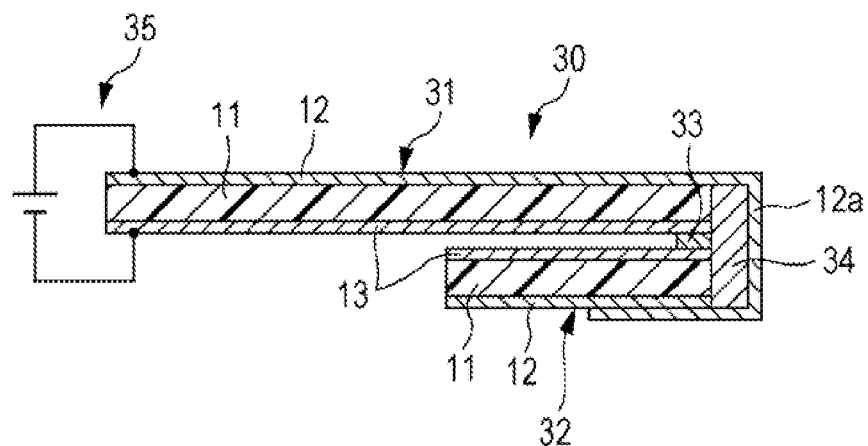
FIG. 4A is vertical section view illustrating the structure of an actuator element of a third embodiment.

FIG. 4A is a vertical section view illustrating the structure of an actuator element of a third embodiment. The actuator element of the third embodiment is one variation of the first embodiment.

Figure 4B:
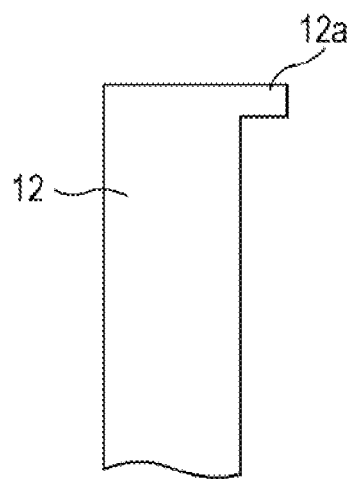
FIG. 4B is a partial plan view of an actuator element according to a variation example of the third embodiment.

An actuator element 30 illustrated in FIG. 4A includes a first element unit 31 and a second element unit 32. As illustrated in FIGS. 4A and 4B, the element length of the second element unit 32 is shorter than the element length of the first element unit 31.

As illustrated in FIG. 4A, each of the first element unit 31 and second element unit 32 has the electrolytic layer 11 and the pair of electrode layers 12 and 13 provided on both side in the direction of thickness of the electrolytic layer 11 illustrated in FIG. 3.

As illustrated in FIG. 4A, in the first element unit 31, the first electrode layer 12 is provided on the top surface of the electrolytic layer 11, and the second electrode layer 13 is provided on the bottom surface of the electrolytic layer 11. On the other hand, in the second element unit 32, the second electrode layer 13 is provided on the top surface of the electrolytic layer 11, and the first electrode layer 12 is provided on the bottom surface of the electrolytic layer 11.

As illustrated in FIG. 4A, the second electrode layer 13 of the first element unit 31 and the second electrode layer 13 of the second element unit 32 are connected at their end positions (the free end of the first element unit 31) through a conductive adhesive 33, for example. On the other hand, the first electrode layer 12 of the first element unit 31 has an extension 12a which extends long in the direction of element length. The extension 12a extends from the surface of an insulator 34 provided at the ends of the first element unit 31 and second element unit 32 to the bottom surface of the second element unit 32 and is electrically connected to the first electrode layer 12 of the second element unit 32. The insulator 34 may not be required. The insulator 34 may be replaced by a space.

According to the embodiment illustrated in FIG. 4A, the second electrode layers 13 facing inside on the first element unit 31 and second element unit 32 are both electrically connected. The first electrode layers 12 facing outside on the first element unit 31 and second element unit 32 are electrically connected. Thus, when voltage is applied to between the first electrode layer 12 and second electrode layer 13 at the fixed end of the first element unit 31 and the first element unit 31 bends upward, the second element unit 32 connected to the free end of the first element unit 31 bends downward.

According to the embodiment in FIGS. 4A and 4B, no separate drive circuit may be required in addition to the first element unit 31 for operating the second element unit 32. As illustrated in FIGS. 4A and 4B, one drive circuit 35 may be enough. Thus, the circuit configuration may be simplified, and the costs may be reduced.

Referring to FIG. 4A, the extension 12a of the first electrode layer 12 facing outside on the first element unit 31 is extended long in the direction of element length to the bottom surface of the second element unit 32. In FIG. 4B (partial plan view), the extension 12a of the first electrode layer 12 facing outside of the first element unit 31 is extended in the direction of width to the bottom surface of the second element unit 32. The use of this form may bring the first element unit 31 and the second element unit 32 into conduction in other parts excluding the ends. For example, even when they are connected at the middle part 24 as in the second embodiment, the first element unit 31 and the second element unit 32 may be brought into conduction easily and properly.

As described above, though the element lengths of the second element units 21 and 32 are shorter than the element lengths of the first element units 20 and 31, the element length L2 (FIG. 1A) of the second element units 21 and 32 are preferably equal to or shorter than the half of the element length L1 of the first element units 20 and 31.

The mass of the second element units 21 and 32 is preferably equal to or smaller than the half of the mass of the first element units 20 and 31.

Figure 5A:
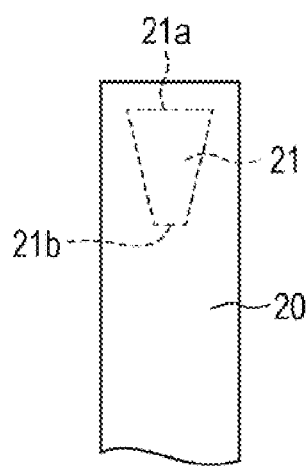
FIGS. 5A and 5B are partial plan views of an actuator element illustrating forms of a first element unit and a second element unit.
Figure 5B:
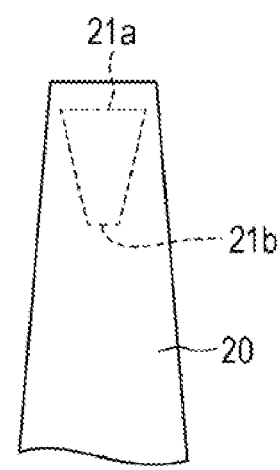

The first element unit 20 may have a substantial rectangular form as illustrated in FIG. 5A (partial plan view) or a substantial trapezoidal form as illustrated in FIG. 5B (partial plan view), for example. The second element unit 21 preferably has a substantial trapezoidal form. For example, a lower base 21a having a longer width is connected to the first element unit 20 as the connected end, and an upper bottom 21b having a shorter width is the free end.

As described above, reducing the element length of the second element units 21 and 32 and limiting their masses may keep a sufficient amount of displacement in this embodiment having the second element units 21 and 32. As illustrated in FIGS. 5A and 5B, the second element unit 21 may have a form allowing a smaller element area instead of a rectangular form and reducing the mass of the second element unit 21. Thus, with a sufficient displacement of the second element unit 21, a sufficient amount of displacement of the entire actuator element may be acquired.

According to the aforementioned embodiment, the direction from the connected ends to the free ends of the second element units 21 and 32 agree with the direction of element length of the first element unit. However, the present invention is not limited thereto. (The same is true in the following embodiments). For example, the direction from the connected end to the free end of the second element units 21 and 32 may be orthogonal to the direction of element length of the first element unit. However, the agreement of the direction from the connected end to the free end of the second element units 21 and 32 with the direction of element length of the first element unit is preferable for reducing the size of the actuator element.

Figure 6A:
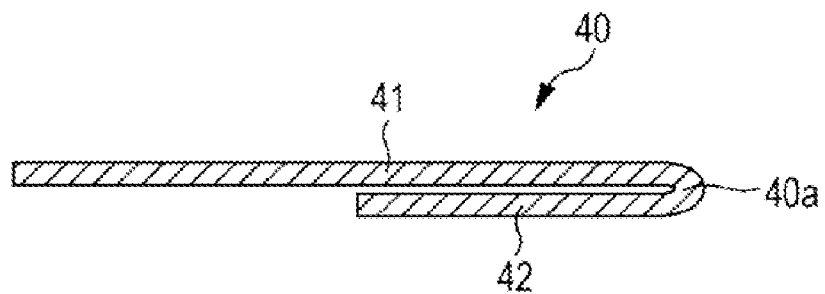
FIG. 6A is a partial section view illustrating the structure of an actuator element of a fourth embodiment.
Figure 6B:
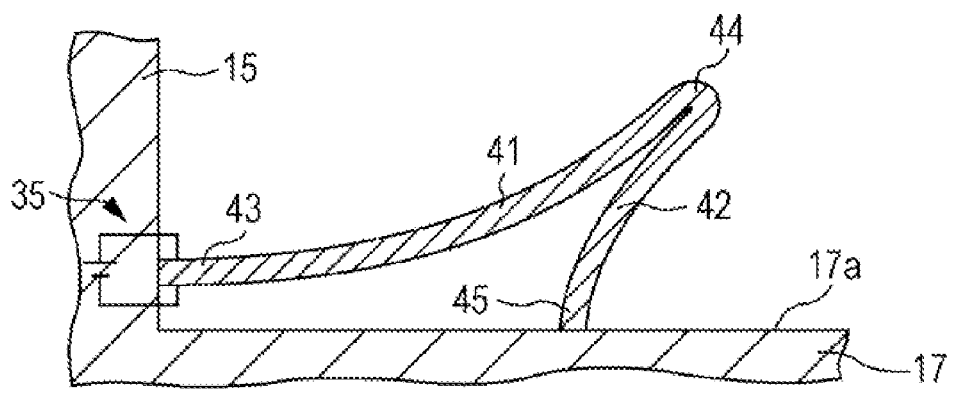
FIG. 6B is a partial section view illustrating an actuator device having the actuator element in FIG. 6A in which the actuator element bends.
Figure 6C:
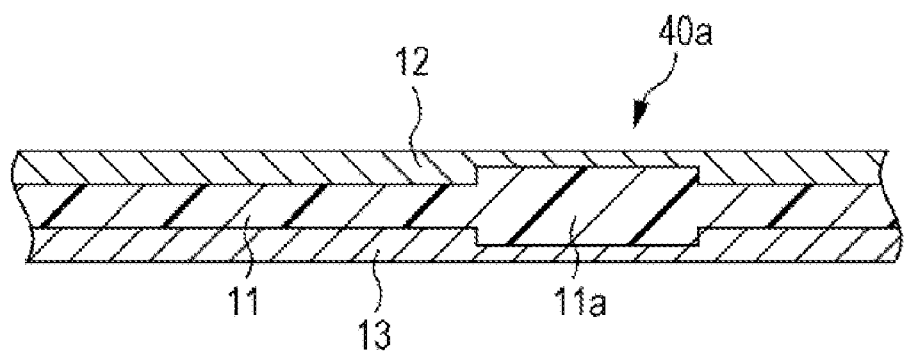
FIG. 6C is a partial enlarged section view illustrating a preferable cross-section form of an actuator element.

FIG. 6A is a partial section view illustrating the structure of an actuator element of a fourth embodiment. FIG. 6B is a partial section view illustrating an actuator device having the actuator element in FIG. 6A in which the actuator element bends. FIG. 6C is a partial enlarged section view illustrating a preferable cross-section form of an actuator element.

An actuator element 40 in FIG. 6A also has the laminate structure illustrated in FIG. 3, for example.

As illustrated in FIG. 6A, a first element unit 41 included in the actuator element 40 is folded back halfway, and the folded part functions as a second element unit 42. As illustrated in FIG. 6A, the element length of the second element unit 42 is shorter than the element length of the first element unit 41. As illustrated in FIG. 6B, a fixed end 43 of the first element unit 41 is fixed to the fixing unit 15. When voltage is applied to the first element unit 41, the first element unit 41 bends upward from the fixed end 43 to the free end 44.

On the other hand, as illustrated in FIG. 6B, the second element unit 42 connected integrally to the free end 44 of the first element unit 41 bends in the opposite direction to the first element unit 41. Then, as illustrated in FIG. 6B, the free end 45 of the second element unit 42 is brought into contact with the surface 17a of the base member 17, and the first element unit 41 bending upward is supported by the second element unit 42.

Referring to FIG. 6B, the principle for the state that the first element unit 41 and second element unit 42 bend in the opposite directions is the same as that for the form illustrated in FIGS. 4A and 4B.

The actuator element 40 illustrated in FIG. 6A may provide a sufficient displacement and a large generated load and generative force in a simple structure. Particularly, the first element unit 41 and the second element unit 42 may be formed by a simple process of manufacture. Like the embodiment in FIG. 4A, one drive circuit 35 may be provided for the first element unit 41 and the second element unit 42. In this way, the simple structure may be implemented effectively, and the costs may be reduced.

After the actuator element 40 is folded back halfway as illustrated in FIG. 6A, the folded part 40a is preferably pressure attached by a press. In this case, as illustrated in FIG. 6C (illustrating the state before folded back), the thick electrolytic layer 11a of the folded part 40a may prevent electro-current constriction caused by the local decrease in thickness of the electrolytic layer 11 of the folded part 40a when the folded part 40a is compressed.

Figure 7A:
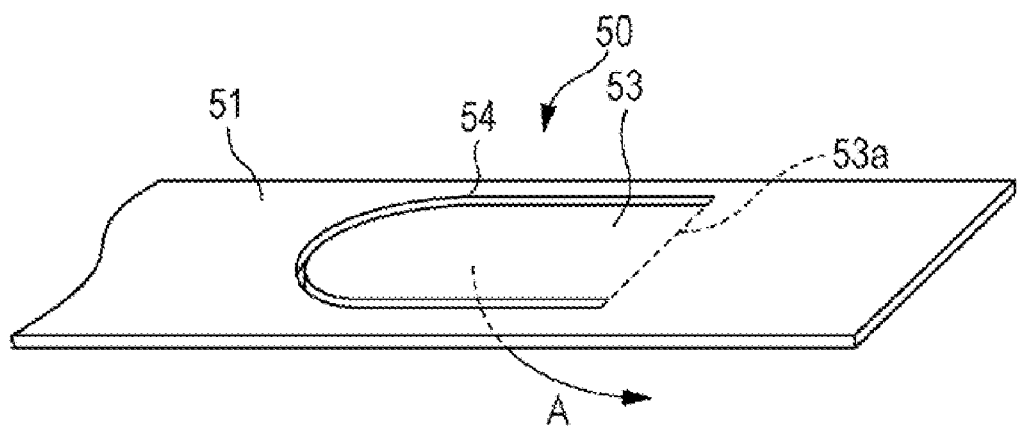
FIGS. 7A and 7B are partial perspective views illustrating an actuator element of a fifth embodiment.
Figure 7B:
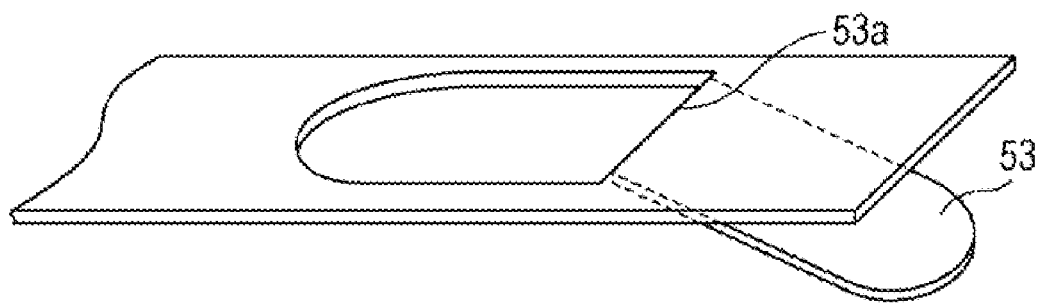

FIGS. 7A and 7B are partial perspective views illustrating an actuator element of a fifth embodiment. FIG. 7A illustrates one step of a manufacturing method. FIG. 7B illustrates a completed actuator element.

An actuator element 50 in FIGS. 7A and 7B has the laminate structure illustrated in FIG. 3, for example. As illustrated in FIG. 7A, a first element unit 51 is cut to form a tongue-shaped second element unit 53. A slit 54 has a substantial U-shape in FIG. 7A, but the invention is not limited to the form.

As indicated by the arrow A in FIG. 7A, the second element unit 53 is folded from the position of the connected end 53a (refer to FIG. 7B). The first electrode layer 12 and second electrode layer 13 (refer to FIG. 3) included in the folded second element unit 53 are provided upside down of the first electrode layer 12 and second electrode layer 13 of the first element unit 51. Thus, when voltage is applied, the second element unit 53 bends in the opposite direction of bending to the direction of bending of the first element unit 51.

According to the embodiment illustrated in FIGS. 7A and 7B, the first element unit 51 is partially cut out to form the second element unit 53. This can prevent the increase of the element area because of the second element unit 53. Moreover, the first element unit 51 and second element unit 53 may be formed by a simple process of manufacture. Because the first element unit 51 and the second element unit 53 have an integral structure, one drive circuit may be provided for the first element unit 51 and the second element unit 53, like the embodiment in FIG. 4A. Thus, the simple structure may be implemented effectively, and the costs may be reduced.

Figure 8A:
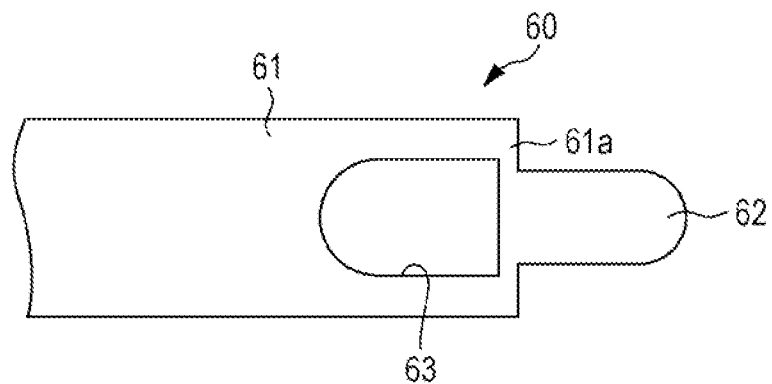
FIGS. 8A and 8B are partial plan views illustrating an actuator element of a sixth embodiment.
Figure 8B:
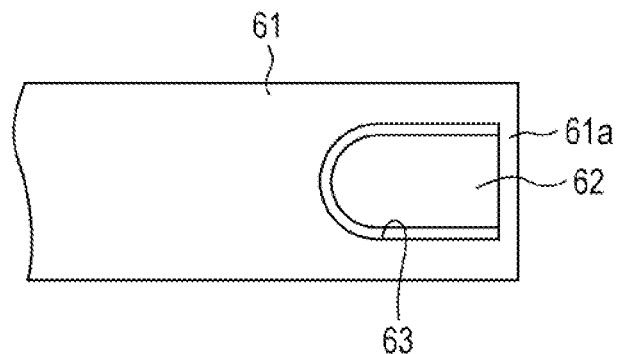

FIGS. 8A and 8B are partial plan views illustrating an actuator element of a sixth embodiment. FIG. 8A illustrates one step of a manufacturing method. FIG. 8B illustrates a completed actuator element.

An actuator element 60 in FIGS. 8A and 8B also has the laminate structure illustrated in FIG. 3, for example. As illustrated in FIG. 8A, a projecting second element unit 62 is provided integrally with a first element unit 61 from a free end 61a of the first element unit 61. As illustrated in FIG. 8B, the second element unit 62 is folded back. As illustrated in FIGS. 8A and 8B, the first element unit 61 has a hole 63 at an opposed position to the folded second element unit 62. In the planer view illustrated in FIG. 8B, the second element unit 62 positions within the hole 63. In this case, a first electrode layer 12 and second electrode layer 13 (refer to FIG. 3) included in the folded second element unit 62 is provided upside down of the first electrode layer 12 and second electrode layer 13 in the first element unit 61. Thus, when voltage is applied, the direction of bending of the second element unit 62 is opposite to the direction of bending of first element unit 61.

According to this embodiment, in a nonoperating state, the second element unit 62 may be set within the hole 63, which may reduce the thickness of the actuator element 60. Moreover, a simple process of manufacture may be used to form the first element unit 61 and the second element unit 62. Because the first element unit 61 and the second element unit 62 are integral, one drive circuit may be provided for the first element unit 61 and the second element unit 62, like the embodiment in FIG. 4A. Thus, a simple structure may be implemented effectively, and the costs may be reduced.

According to all of the aforementioned embodiments, one second element unit is provided. However, a plurality of second element units may be provided.

Figure 9A:
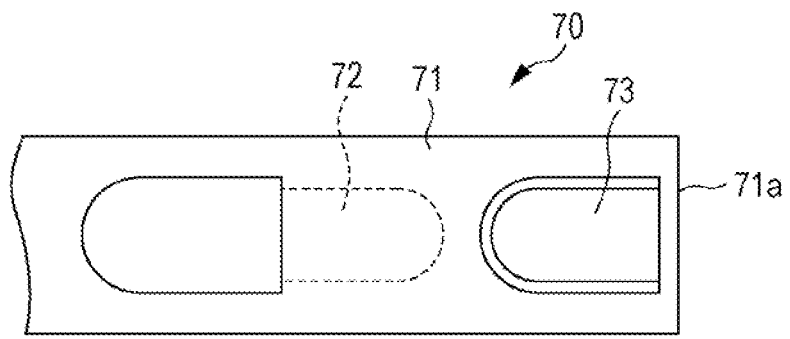
FIGS. 9A and 9B illustrate a combination of the embodiment in FIGS. 7A and 7B and the embodiment in FIGS. 8A and 8B.
Figure 9B:
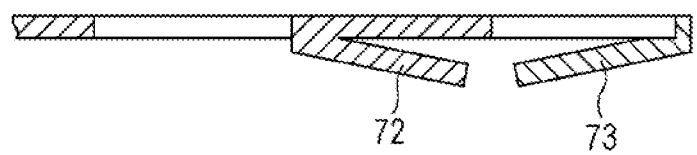

FIGS. 9A and 9B illustrate a combination of the embodiment in FIGS. 7A and 7B and the embodiment in FIGS. 8A and 8B. FIG. 9A is a partial plan view of an actuator element, and FIG. 9B is a section view of FIG. 9A.

An actuator element 70 illustrated in FIGS. 9A and 9B includes two second element units 72 and 73. The second element unit 72 is formed on the basis of the embodiment in FIGS. 7A and 7B, and the second element unit 73 is formed on the basis of the embodiment in FIGS. 8A and 8B.

As illustrated in FIG. 9B, though the element length of the second element unit 72 and the element length of the second element unit 73 are substantially equal, they may have different element lengths. For example, the element length of the second element unit 73 near a free end 71a of the first element unit 71 may be shorter than the element length of the second element unit 72.

The plurality of second element units 72 and 73 may increase the generated load and generative force more effectively. The aforementioned embodiments may be combined to form a plurality of second element units in a simple structure, which can reduce the costs.

Figure 10A:
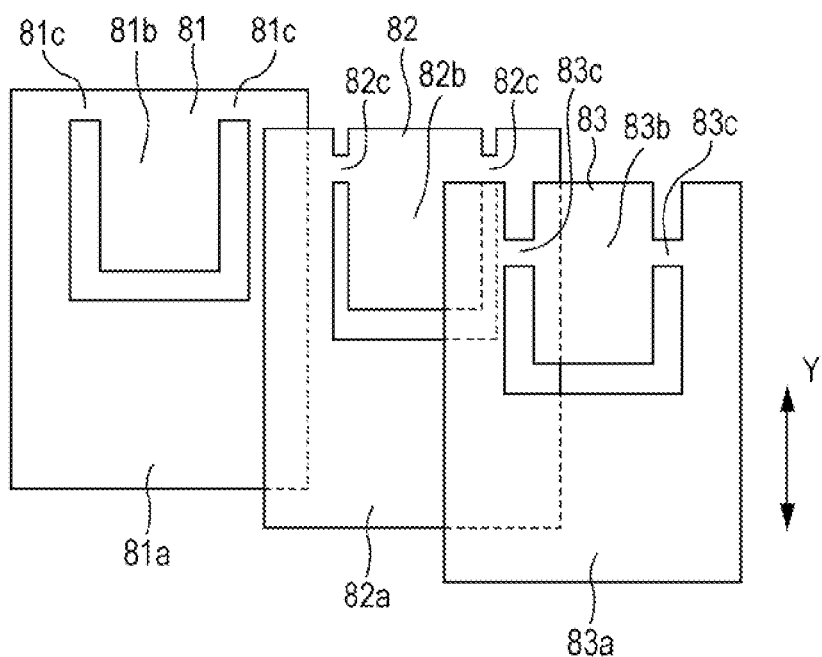
FIGS. 10A to 10C are partial plan views of an actuator element of a seventh embodiment.
Figure 10B:
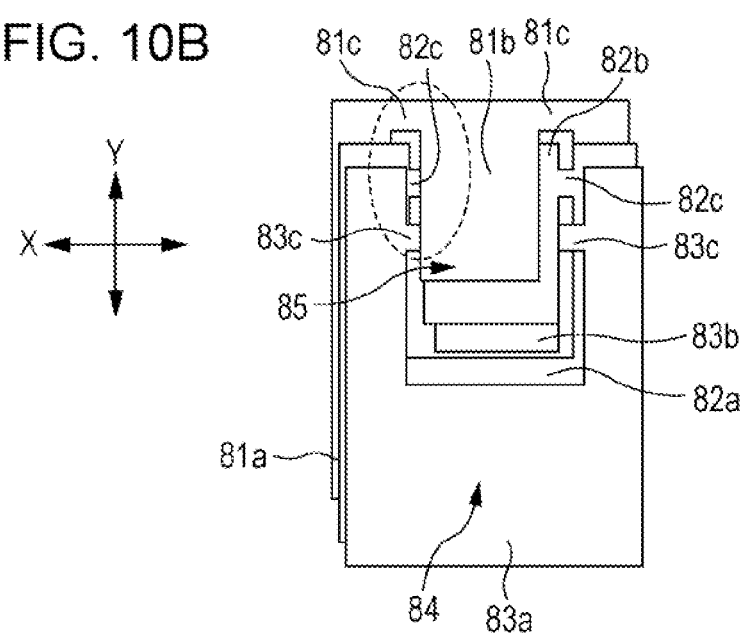

FIGS. 10A and 10B are partial plan views of an actuator element of a seventh embodiment. FIG. 10A is an exploded plan view of a first electrode layer, an electrolytic layer, and a second electrode layer included in an actuator element. FIG. 10B is a plan view illustrating a state where the first electrode layer, electrolytic layer and second electrode layer are stacked. However, FIG. 10B illustrates the layers by slightly displacing them for easy understanding of the arrangement of the layers in the planar view. FIG. 10B does not illustrate the completed state of the actuator element.

As illustrated in FIG. 10A, a first electrode layer 81, an electrolytic layer 82 and a second electrode layer 83 have tongue-shaped second element unit regions (hereinafter, called second regions) 81b to 83b which are cut separately from first element unit regions (hereinafter, called first regions) 81a to 83a. As illustrated in FIG. 10A, the first regions 81a to 83a and the second regions 81b to 83b are connected through connection parts 81c to 83c. The directions of element lengths (Y direction) are displaced such that the positions of the connection parts 81c to 83c do not overlap with the direction of stacking when the first regions 81a to 83a and the second regions 81b to 83b are stacked.

As illustrated in FIG. 10B, when the first region 82a of the electrolytic layer 82 is stacked under the first region 83a of the second electrode layer 83, the second region 82b of the electrolytic layer 82 may be provided above the second region 83b of the second electrode layer 83 because the positions of the connection parts 82c and 83c are displaced in the direction of element length (Y direction). When the first region 81a of the first electrode layer 81 is stacked under the first region 82a of the electrolytic layer 82, the second region 81b of the first electrode layer 81 may be placed above the second region 82b of the electrolytic layer 82 because the positions of the connection parts 81c, 82c, and 83c are displaced in the direction of element length (Y direction).

The arrangement produces the laminate structure as illustrated in FIG. 10B of the first element unit 84 having the overlapped first regions 81a to 83a of the layers in which the first electrode layer 81 is placed under the electrolytic layer 82 and the second electrode layer 83 is placed above the electrolytic layer 82. On the other hand, the second element unit 85 having the overlapped second regions 81b to 83b of the layers has the laminate structure in which the second electrode layer 83 is placed under the electrolytic layer 82 and the first electrode layer 81 is placed above the electrolytic layer 82. In this way, the first electrode layer 81 and second electrode layer 83 appearing on the surface change places with each other in the first element unit 84 and the second element unit 85.

Figure 10C:
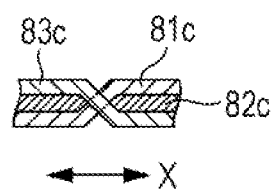

FIG. 10C is a vertical section view which appears by cutting the connection parts 81c to 83c enclosed by the broken line in FIG. 10B in the direction of connection (X direction). As illustrated in FIG. 10C, the connection part 81c of the first electrode layer 81 and connection part 83c of the second electrode layer 83 intersect with each other. Stacking the layers as described above allows the intersection of the connection parts 81c and 83c of the electrode layers 81 and 83 and changing places of the first electrode layer 81 and the second electrode layer 83 in the first element unit 84 and the second element unit 85.

The structure illustrated in FIGS. 10A to 10C is an integral structure in which the same electrode layers 81 and 83 and electrolytic layer 82 are used to form the first element unit 84 and second element unit 85, and the electrode layers 81 and 83 change places in the first element unit 84 and second element unit 85. Thus, when voltage is applied, the first element unit 84 and the second element unit 85 bend in the opposite directions.

According to the embodiment illustrated in FIGS. 10A to 10C, the first element unit 84 and the second element unit 85 may be formed within the substantially same plane. Compared with the structure in which the second element unit is folded back, the stress on the electrolytic layer 82 and/or the electrode layers 81 and 83 may be reduced. The first element unit 84 and the second element unit 85 do not overlap in the direction of thickness of the actuator element, and the first element unit 84 and the second element unit 85 may be formed within the substantially same plane, as described above. Thus, the thickness of the actuator element may be reduced. The embodiment in FIGS. 10A to 10C may have one drive circuit, like the embodiment in FIGS. 4A and 4B, which may reduce the costs.

Figure 11A:
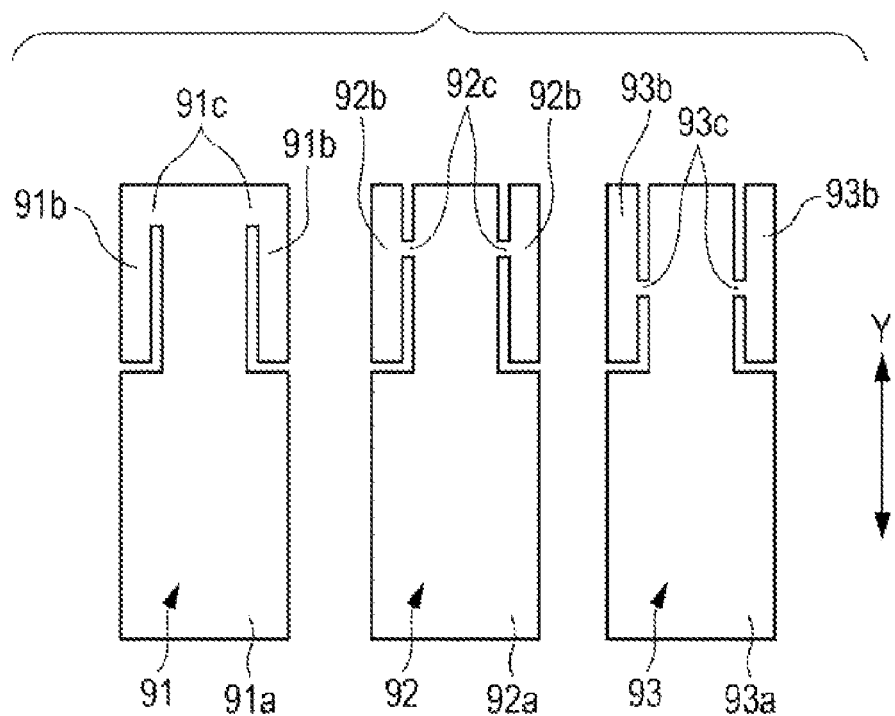
FIGS. 11A and 11B illustrates an embodiment that is a variation example of the embodiment illustrated in FIGS. 10A to 10C, where
Figure 11B:
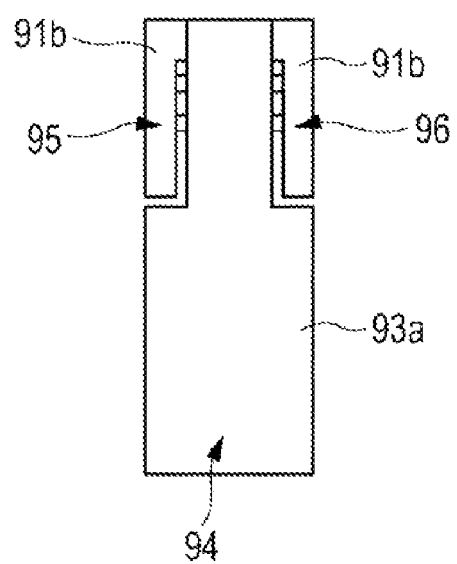

An embodiment illustrated in FIGS. 11A and 11B is a variation example of the embodiment illustrated in FIGS. 10A to 10C. FIG. 11A is an exploded plan view of a first electrode layer, an electrolytic layer, and a second electrode layer included in an actuator element. FIG. 11B is a plan view illustrating a state in which the first electrode layer, electrolytic layer and second electrode layer are stacked.

Referring to FIG. 11A, a first electrode layer 91, an electrolytic layer 92 and a second electrode layer 93 have two cuts, second regions 91b to 93b. The first regions 91a to 93a and the second regions 91b to 93b are connected through connection parts 91c to 93c. The positions of the connection parts 91c to 93c are displaced in the direction of element length (Y direction). Like the one illustrated in FIG. 10B, the first electrode layer 91, electrolytic layer 92 and second electrode layer 93 are stacked, and the connection part 91c of the first electrode layer 91 and the connection part 93c of the second electrode layer 93 are crossed in the vertical section view appearing by cutting them in the direction of connection of the connection parts. Thus, the first electrode layer 91 and second electrode layer 93 appearing on the surfaces in the first element unit 94 and second element units 95 and 96 may change vertical places with each other in the direction of thickness of the electrolytic layer 92. According to the embodiment in FIGS. 11A and 11B, two second element units 95 and 96 may be provided.

Figure 12:
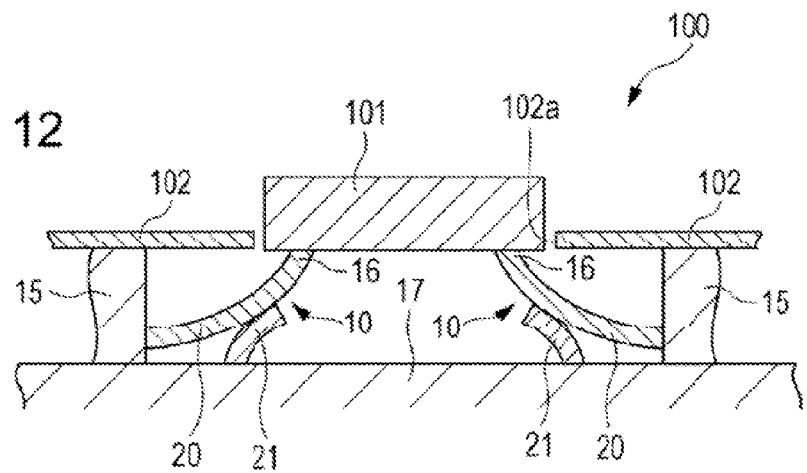
FIG. 12 is a partial section view of an input apparatus according to an embodiment.
Figure 13A:
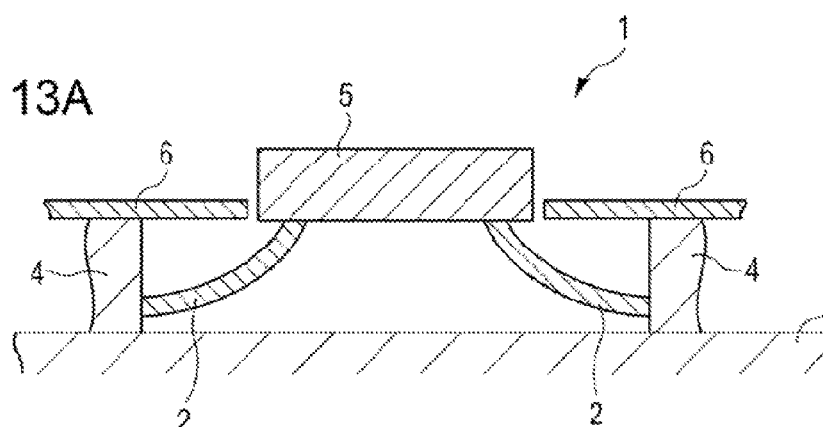
FIGS. 13A and 13B are partial section views of an input apparatus according to an example in the past.
Figure 13B:
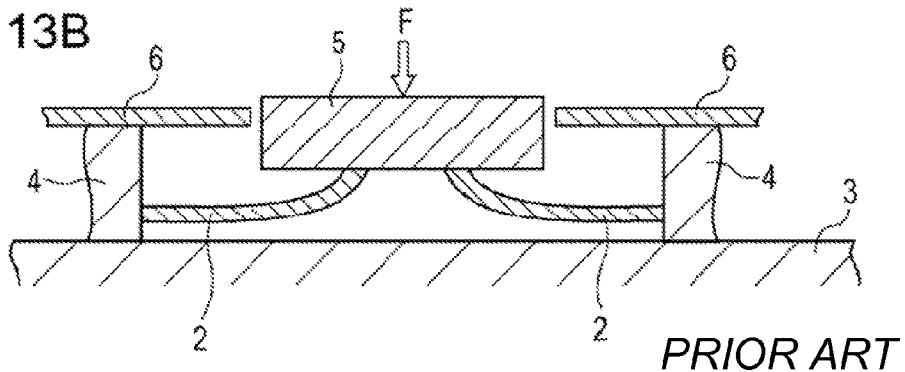

An actuator device according to this embodiment may be applied to an input apparatus 100 as illustrated in FIG. 12. The input apparatus 100 in FIG. 12 has a plurality of actuator elements 10 by using the actuator devices illustrated in FIG. 2A, for example. As illustrated in FIG. 12, a key top (operating unit) 101 is provided in the direction of bending (upper side) of the first element unit 20 in actuator element 10. The actuator device is set within a housing 102, the key top 101 is supported movably in the vertical direction through a hole 102a of the housing 102.

Referring to the partial section view in FIG. 12, when voltage is applied to between electrode layers included in the actuator element 10, the first element units 20 of the actuator elements 10 bend upward. In this case, the second element units 21 bend in the opposite direction to the first element units 20. When the second element unit 21 touch the surface of the base member 17, the first element unit 20 is supported. The key top 101 is lifted upward by a displacing operation on the actuator elements 10.

For example, when a user pushes down the key top 101 with a finger, the key top 101 moves downward. With that, the free ends 16 of the first element units 20 of the actuator elements 10 are pushed and are displaced downward. In this case, according to this embodiment, the first element units 20 are supported by the second element units 21. Thus, a large generated load may be acquired from the actuator elements 10, and the feel of pushing when the key top 101 is pushed may be improved more than before.

What is claimed is:

1. An actuator element comprising:
a first element portion configured to bend in a first direction when a voltage is applied thereto, the first element portion including:
 a fixed end fixed to a fixing unit; and
 a free end configured to move in the first direction when the first element portion bends; and
a second element portion having a length shorter than a length of the first element portion, configured to bend in a second direction opposite to the first direction so as to be capable of supporting the first element portion when the voltage is applied thereto, the second element including:
 a connected end connected to the first element portion; and
 a free end configured to move in the second direction when the second element portion bends.

2. The actuator element according to claim 1, wherein the connected end of the second element portion is connected to the free end of the first element portion or to a middle part between the free end and the fixed end of the first element portion,
and wherein the second element portion extends from the connected end along the first element portion toward the fixed end of the first element portion when the voltage is not applied.

3. The actuator element according to claim 1, wherein the connected end of the second element portion is connected to a middle part between the free end and the fixed end of the first element portion,
and wherein the second element portion extends from the connected end along the first element portion toward the free end of the first element portion when the voltage is not applied.

4. The actuator element according to claim 1,
wherein each of the first element portion and the second element portion includes:
 a first electrode layer;
 a second electrode layer; and
 an electrolytic layer sandwiched between the first and second electrode layers,;

and wherein the first electrode layer of the first element portion and the first electrode layer of the second element portion face each other and are connected to each other in a vicinity of the connected end of the second element portion, and the second electrode layer of the first element portion and the second electrode layer of the second element portion are connected to each other.

5. The actuator element according to claim 1, wherein the first element portion and the second element portion are formed from an element, a part of which is folded back halfway thereunder, and the folded part functions as the second element portion.

6. The actuator element according to claim 1, wherein the first element portion and the second element portion are formed from a plate-shaped element, and wherein the second element portion is formed as a tongue-shaped portion cut into the plate-shaped element and folded back thereunder, a remaining portion of the plate-shaped element being the first element portion.

7. The actuator element according to claim 1, wherein the second element portion is integrally formed with the first element portion and extending from the free end of the first element portion and folded back thereunder, and wherein the first element portion has a hole corresponding to the second element portion facing thereto.

8. The actuator element according to claim 1, wherein the first and second element portions are formed by laminating a first electrode layer, a second electrode layer, and an electrolytic layer sandwiched therebetween, wherein each of the first electrode layer, the electrolytic layer, and the second electrode layer includes:
a first region;
a second region separated from the first region; and
a connection region connecting the first region and the second region;

wherein the first region of the first electrode layer is placed below the first region of the second electrode layer while the second region of the first electrode layer is placed above the second region of the second electrode layer and wherein the first region corresponds to the first element portion and the second region corresponds to the second element region.

9. An input apparatus comprising:
the actuator element according to claim 1;
an operating unit provided on a bending direction side of the first element portion; and
a base member provided on a bending direction side of the second element portion,
wherein the operating unit is movably supported by the actuator element such that the operating unit moves toward the base member and away from the base member,
wherein when the voltage is applied, the first element portion bends toward the operating unit and the second element unit bends toward the base member,
and wherein when the operating unit moving toward the base member pushes the free end of the first element portion, the first element portion is supported by the second element portion bending toward the base member.

* * * * *